United States Patent [19]
Jun

[11] Patent Number: 5,900,072
[45] Date of Patent: May 4, 1999

[54] INSULATING LAYER STRUCTURE FOR SEMICONDUCTOR DEVICE

[75] Inventor: Young Kwon Jun, Seoul, Rep. of Korea

[73] Assignee: LG Semicon Co., Ltd., Cheongju, Rep. of Korea

[21] Appl. No.: 08/978,595

[22] Filed: Nov. 25, 1997

Related U.S. Application Data

[62] Division of application No. 08/573,103, Dec. 15, 1995, Pat. No. 5,783,484.

[30] Foreign Application Priority Data

Sep. 2, 1995 [KR] Rep. of Korea .................. 95-28690

[51] Int. Cl.$^6$ .................................................. H01L 21/00
[52] U.S. Cl. ........................... 148/33.3; 216/38; 438/692
[58] Field of Search ................................ 438/691, 692, 438/723–725, 756, 757; 216/19, 38, 39; 148/33.3, 33.4, 33.5

[56] References Cited

U.S. PATENT DOCUMENTS

| | | | |
|---|---|---|---|
| 559,055 | 9/1896 | Chang et al. . | |
| 4,702,792 | 10/1987 | Chow et al. ............................. | 438/692 |
| 4,816,115 | 3/1989 | Horner et al. ...................... | 438/725 X |
| 4,838,991 | 6/1989 | Cote et al. ......................... | 438/725 X |
| 4,894,351 | 1/1990 | Batty . | |
| 4,978,419 | 12/1990 | Nanda et al. ........................ | 438/725 X |
| 5,043,789 | 8/1991 | Linde et al. . | |
| 5,110,763 | 5/1992 | Matsumoto . | |
| 5,270,259 | 12/1993 | Ito et al. .............................. | 438/725 X |
| 5,272,117 | 12/1993 | Roth et al. . | |
| 5,283,208 | 2/1994 | Lorsung et al. ..................... | 438/691 X |
| 5,342,800 | 8/1994 | Jun . | |
| 5,352,630 | 10/1994 | Kim et al. . | |
| 5,384,288 | 1/1995 | Ying . | |
| 5,407,860 | 4/1995 | Stoltz et al. . | |
| 5,486,493 | 1/1996 | Jeng . | |
| 5,494,857 | 2/1996 | Cooperman et al. . | |

FOREIGN PATENT DOCUMENTS

482247 A1 4/1992 European Pat. Off. .

*Primary Examiner*—William Powell
*Attorney, Agent, or Firm*—Fleshner & Kim

[57] ABSTRACT

A structure of an insulating layer in a semiconductor device includes a substrate, at least one inorganic insulating layer pattern formed on the substrate, and an organic insulating layer formed on an upper part of the substrate and the inorganic insulating layer pattern. Also, a method for planarizing the insulating layer includes the steps of forming a substrate, forming a base insulating layer having a step coverage to form an upper region and a lower region on the substrate, forming a first insulating layer on the base insulating layer, selectively etching the first insulating layer to form at least one first insulating layer at a lower region of the base insulating layer, and forming a second insulating layer at the upper part of the first insulating layer including a first insulating layer pattern.

17 Claims, 5 Drawing Sheets

INSULATING LAYER STRUCTURE FOR SEMICONDUCTOR DEVICE

This application is a divisional of application Ser. No. 08/573,103, filed Dec. 15, 1995, now U.S. Pat. No. 5,783,484.

BACKGROUND OF THE INVENTION

1. Field of the Invention

The present invention relates to a semiconductor device, and more particularly to a structure and a planarizing method in an insulating layer of a semiconductor device by which insulating layers made of organic and inorganic substances are aligned on the same plane and the insulating layers are planarized by reducing a step coverage.

2. Description of the Prior Art

Recently, a chip size of a semiconductor circuit is in a tendency of increasing, thus, a switching speed of the circuit has much influence on a transmitting speed of wiring. For instance, assuming that a resistance of the wiring is R and a capacitance of an insulating layer is C, the chip speed becomes low due to a "R.C" time delay effect.

Therefore, a study for improving the "R.C" time delay is proceeding by adapting a low resistance wiring substance such as Cu instead of an aluminum for an insulating layer, and an organic polymer having a dielectric constant such as a benzocyclobutene(BCD) polymer or a fluorinated polyimide instead of a silicon oxide film. However, since the organic polymer has a higher thermal expansion coefficient than the inorganic substance, it is easily deformed during a thermal process and mechanical strength thereof is degraded.

Additionally, as the semiconductor circuit is integrated, a topology in a structure of a lower part of the wiring in the memory device is increased, for which a method for planarizing the insulating layer is required in order to obtain margins of an alignment accuracy and a depth of focus in lithography process for forming a contact hole or a conductor line.

SUMMARY OF THE INVENTION

Therefore, an object of the present invention is to provide a structure for an insulating layer and a method for planarizing the insulating layer in a semiconductor device by which a step coverage is reduced to thereby perform a planarization of the insulating layer.

Another object of the present invention is to provide a structure for an insulating layer and a method for planarizing the insulating layer in a semiconductor device in which a mechanical strength is improved and a thermal deformation hardly occurs.

In order to obtain the above objects, a structure of an insulating layer of a semiconductor device includes a substrate; at least one inorganic insulating layer pattern formed on the substrate; and an organic insulating layer formed on the substrate and the inorganic insulating layer pattern.

In order to obtain the first object, there is provided a method for planarizing an insulating layer including the steps of: forming a substrate; forming a base insulating layer having a step to form an upper region and a lower region on the substrate; forming a first insulating layer on the base insulating layer; selectively etching the first insulating layer to form at least one first insulating layer at the lower part of the base insulating layer; and forming a second insulating layer at the upper part of the first insulating layer including the first insulating layer pattern.

Also, in order to obtain the second object, there is provided a method for planarizing an insulating layer including the steps of: forming a substrate; forming a base insulating layer having a step coverage to form an upper region and a lower region on the substrate; forming a first insulating layer on the base insulating layer; etching the first insulating layer to leave a predetermined thickness at the upper region and the lower region of the base insulating layer and forming at least one first insulating layer pattern at the lower region; and forming a second insulating layer on the first insulating layer including the first insulating layer pattern.

DETAILED DESCRIPTION OF THE INVENTION

The preferredembodiments of the present invention will now be describe in detail with reference to the accompanying drawings.

Figure 1A:
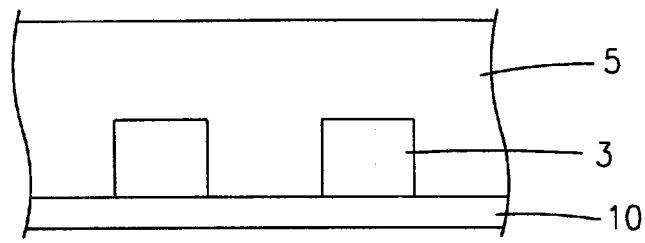
FIGS. 1A to 1C show structures of a variety of insulating layers of a semiconductor device in accordance with the present invention.
Figure 1B:
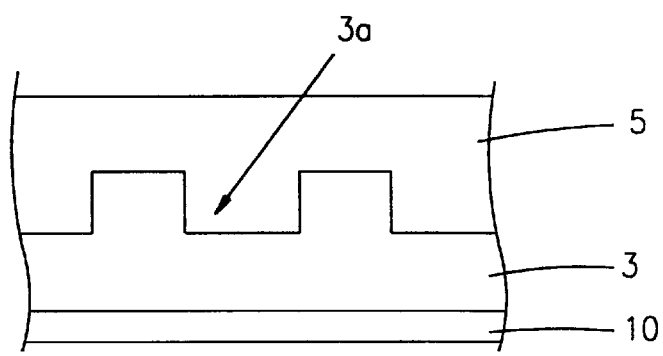
Figure 1C:
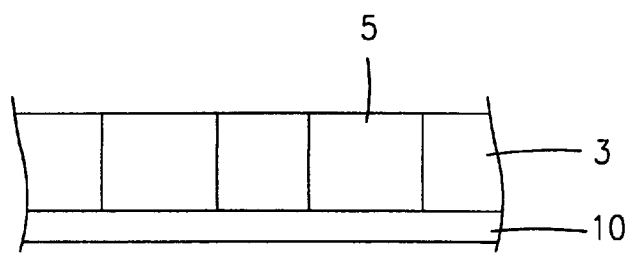

FIGS. 1A to 1C show various embodiments of structures of an insulating layer according to the present invention.

A structure of the insulating layer of the semiconductor device according to one embodiment of the present invention mainly includes a substrate 10, a first insulating layer 3 formed at regular intervals on the substrate 10, and a second insulating layer 5 formed on the upper part of the substrate 10 and a first insulating layer pattern(not shown). In this respect, assuming that the first insulating layer 3 is made of inorganic substance, the second insulating layer 5 is made of organic substance. The first and the second insulating layers can be alternatively changed to be made vice versa, and formed adjacent to each other as shown in FIG. 1(A).

Another embodiment of the insulating layer of the semiconductor device according to the present invention mainly includes; a substrate 10 ; a first insulating layer 3 having a groove 3a and formed on the substrate 10; and a second insulating layer 5 formed in a predetermined thickness on the first insulating layer 3. The first and the second insulating layers 3 and 5 also can be alternatively changed to each other with respect to the organic or the inorganic insulating layer to be used as desired by a user.

Still another embodiment of the insulating layer can be constructed in that, as shown in FIG. 1(C), a first insulating layer 3 and a second insulating layer 5 can be alternatively arranged on the upper part of the substrate 10. In this connection, a description regarding organic and inorganic substances to be used for the first and the second insulating layers is omitted here and may be referred to a method for planarizing the insulating which will be described later.

As stated above, the structures of the insulating layer of the semiconductor according to the present invention can be obtained in various manners as constructed above.

In the meantime, a method for planarizing the insulating layer by using such insulating layer structures as constructed above will now be described.

Figure 2A:
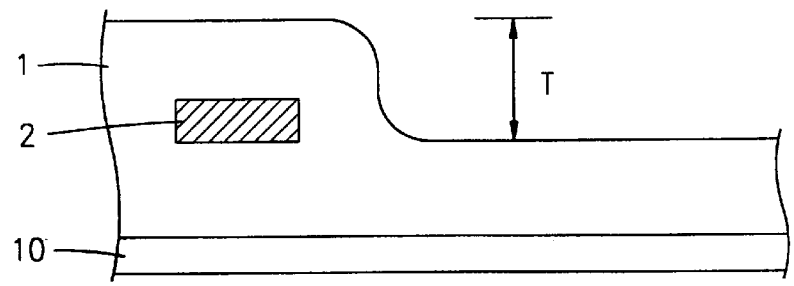
FIGS. 2A to 2E show steps for planarizing method of an insulating layer of one embodiment in accordance with the present invention.

As shown in FIG. 2A, reference numeral 1 denotes a base insulating layer, and reference numberal 2 denotes a conductor line. As to the planarizing method for the insulating layer according to one embodiment of the present invention, there are formed the conductor line 2 and the base insulating layer 1 for isolating the conductor line 2 at the upper part of the substrate 10. The base insulating layer 1 is preferably made by an oxide layer.

Figure 2B:
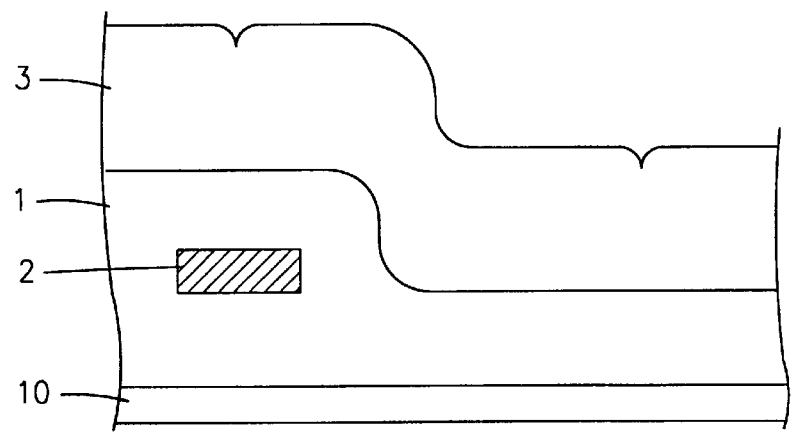

Referring to FIG. 2(A), "T" refers to a step coverage existing between a portion where a topology is relatively high from the substrate 10 and a portion where a topology is relatively low from the substrate 10, namely, the difference caused due to the height between the upper region and the lower region of the base insulating layer 1 formed on the substrate 10. On the upper part of the base insulating layer 1, as shown in FIG. 2(B), a first insulating layer 3 made of the organic or the inorganic substance is formed at the same plane. In this respect, the fact that the first insulating layer 3 is alternatively made of the organic or the inorganic substance signifies a selection of one from the various embodiments of the planarization structures of the insulating layers as described above.

Figure 2C:
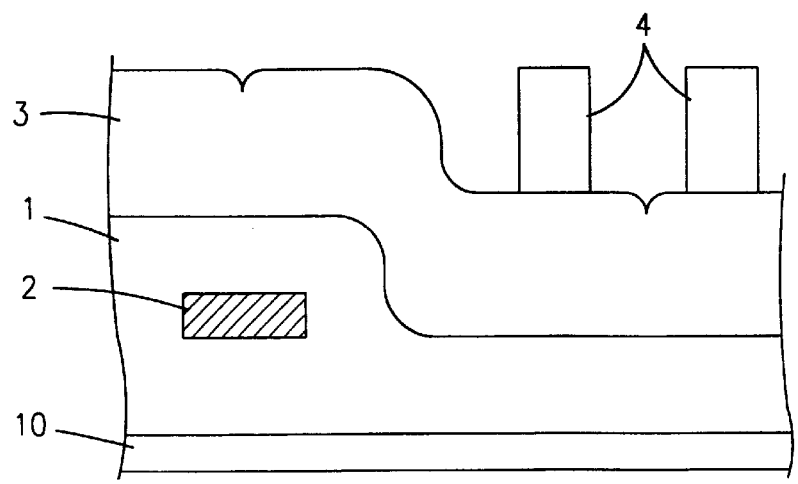

To begin with, as shown in FIG. 2(C), photoresist 4 is selectively coated for forming at least one independent pattern at a predetermined portion, namely, the lower region (that is, where the topology is relatively low) of the first insulating layer 3. The pattern interval of the photoresist 4 is below 10,000 Å.

The first insulating layer 3 is preferably formed in an independent pattern having a height corresponding to the step "T" and an interval below 10,000 Å, for the purpose of readily filling other insulating layer (possibly the second insulating layer 5 to be introduced later) when it is deposited. The photoresist 4 connectedly formed with the upper part of the first insulating layer 3 is removed by etching.

Figure 2D:
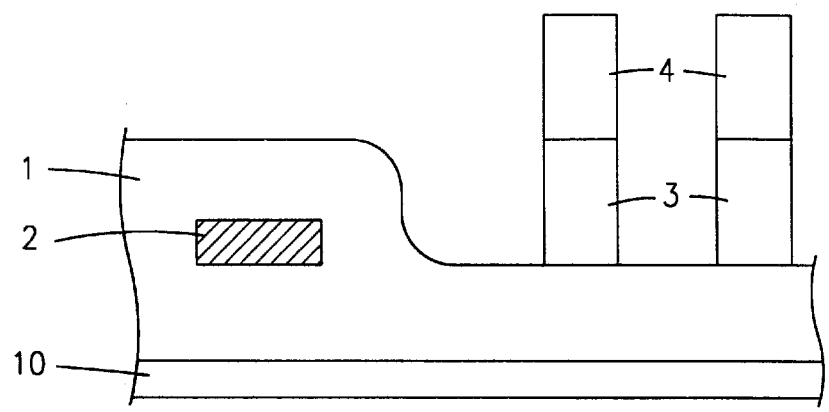
Figure 2E:
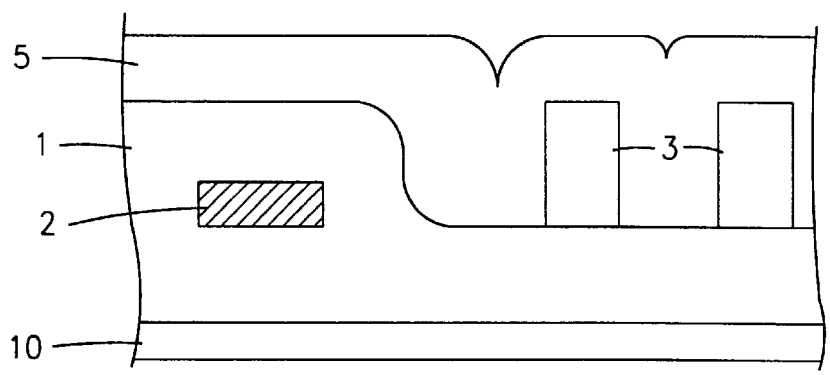

After etching the photoresist 4, as shown in FIG. 2E, the second insulating layer 5 made of organic or inorganic substance is formed at the upper part of the base insulating layer 1 and the first insulating layer 3. The first insulating layer 3 and the second insulating layer 5 are made of organic or inorganic substance, respectively and alternatively. The organic substance is one selected from benzocyclobutune polymer, fluorinated polyimide, or parylene-N. The inorganic substance is one selected from an oxide layer or a nitride layer. By doing that, as to the planarization method for the insulating layer, since the first and the second insulating layers 3 and 5 are made of the organic or the inorganic substance, the step coverage "T" can be reduced below 2,000 Å at minimum.

FIGS. 3A to 3F show another embodiment according to the present invention.

Figure 3A:
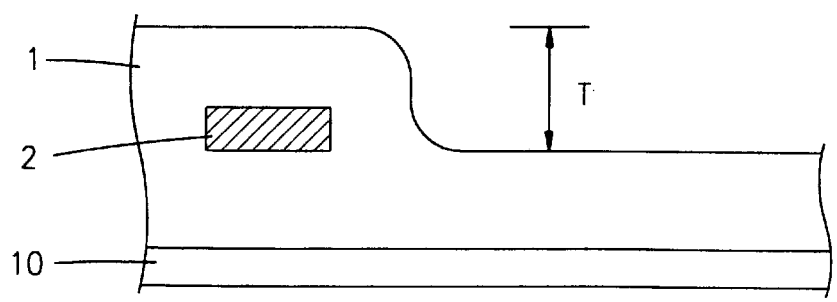
FIGS. 3A to 3F show steps for planarizing method of an insulating layer of another embodiment in accordance with the present invention.
Figure 3B:
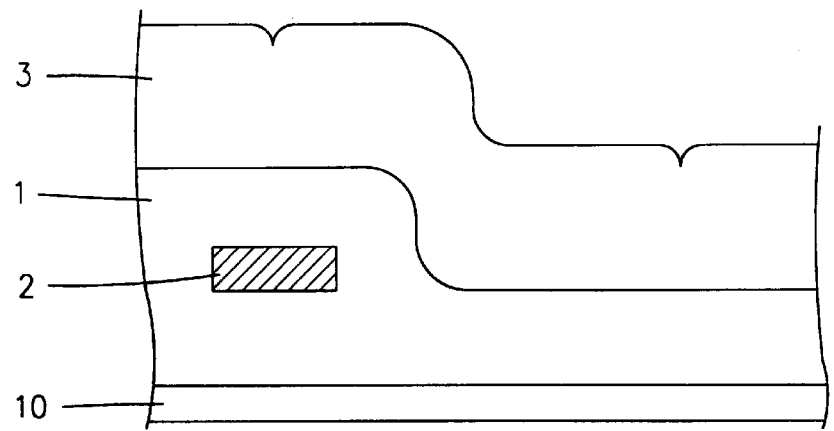
Figure 3C:
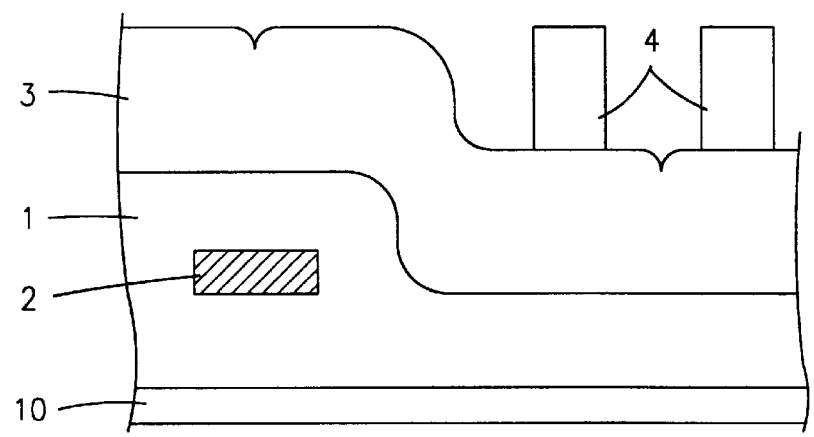

To begin with, a process in an embodiment shown in FIGS. 3A to 3C is similar to or the same as that for forming the photoresist 4 as in the previous embodiment.

A method for planarizing an insulating layer according to this embodiment of the present invention is constructed as follows. As shown in FIG. 3A, a base insulating layer is formed having a step "T" to form an upper region and the lower region on a substrate. A conductor line 2 is formed at a predetermined portion of the base insulating layer 1. A first insulating layer 3 is formed at the upper part of the base insulating layer 1, as shown in FIG. 3B.

Figure 3D:
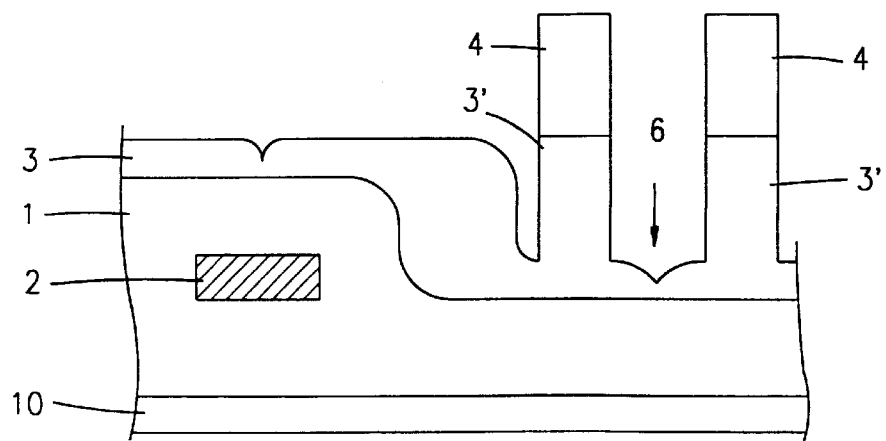

After photoresist 4 is formed at the lower region of the first insulating layer 3 as shown in FIG. 3C, the first insulating layer 3 is etched so as to leave a predetermined thickness on the upper region and the lower region of the base insulating layer 1 as shown in FIG. 3D, and to thereby form at least one first insulating layer pattern on the lower region. That is, a trench pattern 6 is formed on the first insulating layer 3 as shown in FIG. 3D. In this respect, the first insulating layer 3 is not made to be such as independent pattern form as in the previous embodiment but formed as the trench pattern 6 form. That is, referring to FIG. 2D, the lower insulating layer 3 selectively remains by being connected to the lower part of the photoresist 4. However, in this embodiment, as shown in FIG. 3(D), the first insulating layer 3 is wholly and lowerly formed on the upper surface of the base insulating layer 1 and at the lower part of the photoresist 4.

Figure 3E:
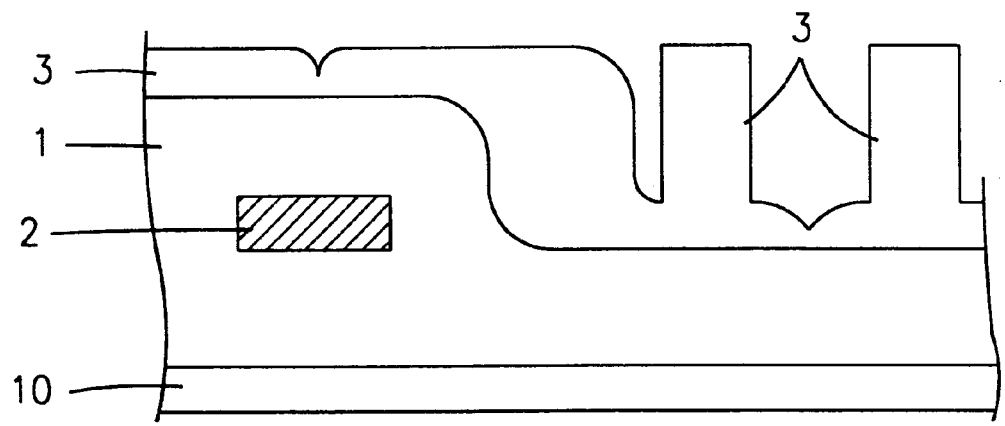
Figure 3F:
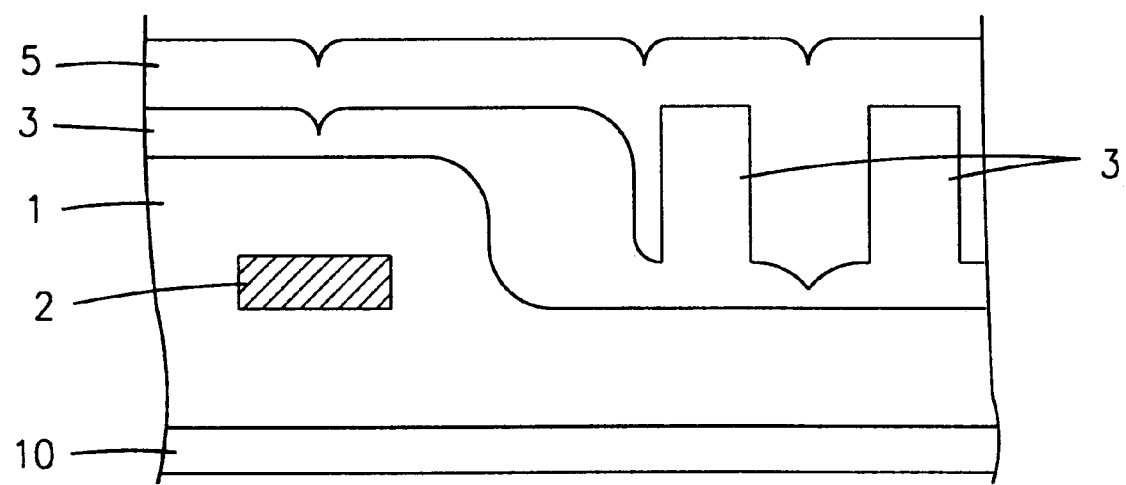

The photoresist 4 formed on the first insulating layer 3 is removed by etching, as shown in FIG. 3E. Then, as shown in FIG. 3F, a second insulating layer 5 made of organic or inorganic substance including a first insulating layer pattern is formed on the first insulating layer 3.

In a planarization method for the insulating layer according to this embodiment, likewise in the embodiment described above, the base insulating layer 1 uses an oxide layer, and the first and the second insulating layers 3 and 5 are alternatively made of organic or inorganic substance, of which its method is the same.

As so far described, by using the planarization method for the insulating layer according to this embodiment, the lower insulating layer or the upper insulating layer are made of the organic substance, so that R.C time delay can be improved owing to the low dielectric constant.

Moreover, according to the embodiments of the present invention, the organic insulating layer and the inorganic insulating layer are mutually engaged, so that the thermal deformation and the mechanical strength can be improved. In addition, without using such an etch-back process of a chemical mechanical polish used in conventional art, the step can be reduced only by the simple pattern formation and the insulating layer formation to thereby planarize the insulating layer, so that a reliability of entire process can be accomplished.

What is claimed is:

1. An insulating device, comprising:
   a substrate;
   a base insulating layer having a step coverage on the substrate with a vertical step height between an upper region and a lower region;
   a first insulating layer on the base insulating layer having a thickness and having at least one first insulating layer pattern at the lower region of the base insulating layer, the first insulating layer pattern being separated from the upper region of the step coverage by a horizontal distance; and
   a second insulating layer on the first insulating layer including the first insulating layer pattern.

2. The insulating device of claim 1, further comprising a signal line over the substrate beneath the upper region of the step coverage.

3. The insulating device of claim 1, wherein the first insulating layer is an organic substance and the second insulating layer is an inorganic substance.

4. The insulating device of claim 3, wherein the organic substance is selected from one of benzocyclobutene polymer, fluorinated polyimide or parylene-N, and the inorganic substance is selected from one of an oxide layer and a nitride layer.

5. The insulating device of claim 1, wherein the first insulating layer is an inorganic substance and the second insulating layer is an organic substance.

6. The insulating device of claim 5, wherein the organic substance is selected from one of benzocyclobutene polymer, fluorinated polyimide or parylene-N, and the inorganic substance is selected from one of an oxide layer and a nitride layer.

7. An insulating device, comprising:

a substrate;

a first insulating layer on the substrate, the first insulating layer having a first region with a first surface and a second region with a second surface such that a step coverage of a first vertical height is formed between the first and second surfaces;

a second insulating layer having a thickness on the first and second regions, wherein the second insulating layer has an insulating pattern on the second region of the first insulating layer, the insulating pattern being separated from the first region of the first insulating layer by a horizontal distance;

a third insulating layer over the second insulating layer and the insulating pattern.

8. The insulating device of claim 7, wherein said insulating pattern has a recess of a second height, wherein the second height is less than the first height.

9. The insulating device of claim 3, wherein the second insulating layer is an organic substance and the third insulating layer is an inorganic substance.

10. The insulating device of claim 9, wherein the organic substance is selected from one of benzocyclobutene polymer, fluoridated polyimide or parylene-N, and the inorganic substance is selected from one of an oxide layer and a nitride layer.

11. The insulating device of claim 7, wherein the third insulating layer is an organic substance and the second insulating layer is an inorganic substance.

12. The insulating device of claim 11, wherein the organic substance is selected from one of benzocyclobutene polymer, fluorinated polyimide or parylene-N, and the inorganic substance is selected from one of an oxide layer and a nitride layer.

13. A planarized insulating layer, comprising:

a substrate;

a base insulating layer having a step coverage on the substrate with a vertical step height between an upper region and a lower region;

a first insulating layer on the base insulating layer having at least one first insulating layer pattern at the lower region of the base insulating layer; and a second deposited insulating layer on the base insulating layer and the first insulating layer including the at least one first insulating layer pattern, wherein a top surface of the second deposited insulating layer is substantially planar.

14. The planarized insulating layer of claim 13, wherein the first insulating layer is an organic substance and the second insulating layer is an inorganic substance.

15. The planarized insulating layer of claim 14, wherein the organic substance is selected from one of benzocyclobutene polymer, fluorinated polyimide or parylene-N, and the inorganic substance is selected from one of an oxide and a nitride layer.

16. The planarized insulating layer of claim 13, wherein the first insulating layer is an inorganic substance and the second insulating layer is an organic substance.

17. The insulating device of claim 16, wherein the organic substance is selected from one of benzocyclobutene polymer, fluorinated polyimide or parylene-N, and the inorganic substance is selected from on of an oxide layer and a nitride layer.

* * * * *